(12) United States Patent
Itoh

(10) Patent No.: US 6,181,147 B1
(45) Date of Patent: Jan. 30, 2001

(54) DEVICE EVALUATION CIRCUIT

(75) Inventor: Masanori Itoh, Tokyo (JP)

(73) Assignee: Oki Electric Industry Co., Ltd., Tokyo (JP)

(*) Notice: Under 35 U.S.C. 154(b), the term of this patent shall be extended for 0 days.

(21) Appl. No.: 09/143,238

(22) Filed: Aug. 28, 1998

(30) Foreign Application Priority Data

Sep. 8, 1997 (JP) .................................................. 9-242590

(51) Int. Cl.$^7$ .................................................. G01R 31/02
(52) U.S. Cl. .................................................. 324/755; 324/765
(58) Field of Search .................................. 324/158.1, 73.1, 324/755, 765; 333/246, 247, 248; 439/581, 63

(56) References Cited

U.S. PATENT DOCUMENTS

| | | | |
|---|---|---|---|
| 4,901,012 | * 2/1990 | Gloanec et al. | 324/158.1 |
| 5,014,115 | * 5/1991 | Moser | 324/158.1 |
| 5,420,506 | * 5/1995 | Lin | 324/754 |
| 5,506,513 | * 4/1996 | Bacher | 333/246 |

* cited by examiner

*Primary Examiner*—Vinh P. Nguyen
(74) *Attorney, Agent, or Firm*—Venable; Robert J. Frank

(57) ABSTRACT

A device evaluation circuit capable of easily matching the impedance of a mounted IC to be measured to that of a measurement system. In the device evaluation circuit, a ceramic head used to improve durability of the device evaluation circuit comprises a base and, for example, ceramic plates. Micro strip lines electrically connected to corresponding micro strip lines of a substrate are respectively formed on the ceramic plates. Further, ground patterns are respectively formed on the ceramic plates. Matching devices are implemented between the micro strip line and the ground patterns and between the micro strip line and the ground patterns respectively so that impedance matching is easily done in the neighborhood of an IC to be measured.

26 Claims, 4 Drawing Sheets

DEVICE EVALUATION CIRCUIT

BACKGROUND OF THE INVENTION

1. Field of the Invention

This invention relates to a device evaluation circuit used to evaluate electric characteristics of a semiconductor device (hereinafter called "IC") or the like of a type wherein elements such as a GaAs (Gallium Arsenide) field effect transistor, etc. are incorporated in a package, and capable of matching the impedance of a measurement system to that of the IC.

2. Description of the Related Art

FIG. 2 is a perspective view showing an essential part of a conventional device evaluation circuit.

The device evaluation circuit is used to evaluate dc and high-frequency electric characteristics of an IC. The device evaluation circuit comprises a board or substrate 10 and a ceramic head 20 which serves as an evaluation jig. A co-planar distributed constant circuit made up of a micro strip line 11 used as a central conductor and ground conductors 12 placed on both sides of the micro strip line 11 at a predetermined distance away is formed on the surface of the substrate 10. Each of the ground conductors 12 is electrically connected to a ground placed on the lower side of the substrate 10 through an unillustrated through hole or the like. An accommodation or storage part 13 opened by cutting the micro strip line 11 is formed in the center of the substrate 10. The ceramic head 20 is held in the storage part 13 so as to be insertable therein and removable therefrom. The ceramic head 20 comprises a pedestal or base 21 made of a conductive metal, ceramic plates 22 and 23 used as insulative members, which are fixed onto the base 21 with a predetermined interval defined therebetween, and micro strip lines 24 and 25 used as wiring patterns, which are respectively formed on the ceramic plates 22 and 23. The base 21 is electrically connected to the ground by being held within the storage part 13. The micro strip lines 24 and 25 are electrically connected to the cut micro strip lines 11 placed on both sides of the substrate 10.

An IC 30 is mounted between the ceramic plates 22 and 23 of the ceramic head 20. The IC 30 has a GaAs FET incorporated therein. A gate terminal 31 of the FET incorporated in the IC 30 is electrically connected to the micro strip line 24. Further, a drain terminal 32 thereof is electrically connected to the micro strip line 25 and a source terminal 33 thereof is electrically connected to the base 21.

When the entire device evaluation circuit is made up of a lexolight substrate or the like, the ceramic head 20 presents a problem in durability when it is desired to evaluate many ICs 30 or the like. Therefore, the ceramic head 20 is held within the substrate 10 to ensure the durability.

Upon evaluating a high-frequency characteristic of the IC 30, it is necessary to match the characteristic impedance of the IC 30 to that of an unillustrated external measurement system for inputting a signal to and outputting it from the IC 30 through the micro strip lines 11, 24 and 25. When the characteristic impedances are mismatched to each other, power is reflected from a junction point and hence the original characteristic of the IC 30 cannot be evaluated. The device evaluation circuit serves as a characteristic impedance converter for making a match between the characteristic impedance of the measurement system and that of the IC 30 (for matching the characteristic impedance of the measurement system to that of the IC 30). Matching elements or devices 35 such as trimmer condensers whose capacitance values are variable, chip capacitors or chip coils or the like, are mounted between the cut micro strip lines 11 and each of the ground conductors 12. The matching devices 35 are mounted therebetween and the matching of the characteristic impedances between the measurement system and the IC 30 is done, whereby the characteristic of the IC 30 is evaluated.

However, the conventional device evaluation circuit has the following problems:

A characteristic impedance of a general measurement system is 50 ohms and a characteristic impedance of an IC 30 available for power application is about a few ohms. The more the difference between the characteristic impedances increases, the more difficult the fabrication of a matching circuit becomes. As the characteristic impedance of the IC 30 becomes small in particular, it becomes hard to match the characteristic impedance of the IC 30 to that of the measurement system. On the other hand, since the gate width is increased to provide a large current flow in the recently-available IC 30, input/output characteristic impedances are significantly reduced. Since the characteristic impedance of the micro strip line 11 is 50 ohms and the characteristic impedances of the micro strip lines 24 and 25 of the ceramic head 20 are respectively about 20 ohms, for example, the implementation of the matching devices 35 becomes effected at their corresponding positions near the IC 30 to form a matching circuit for the IC 30 having such low input/output characteristic impedances. In the device evaluation circuit using the insertable and removable ceramic head 20 or the like, however, the matching devices 35 such as the capacitors or the like cannot be implemented in the vicinity of the IC 30.

There may be cases in which the gate terminal 31 and drain terminal 32 of the IC 30 are respectively biased to suitable potentials upon measuring and evaluating the electric characteristic. The placement of bias lines for providing such biasing in the vicinity of the IC 30 allows a reduction in loss developed upon measurement of the electric characteristic. However, the device evaluation circuit using the ceramic head 20 or the like shown in FIG. 2 has a problem in that the bias lines are placed on the substrate 10 side and their positions to apply the bias to the IC 30 are distant.

SUMMARY OF THE INVENTION

With the foregoing problems in view, it is therefore an object of the present invention to provide a device evaluation circuit capable of easily matching the impedance of a mounted IC to be measured to that of a measurement system.

According to this invention, a device evaluation circuit comprising:

a substrate, a central conductor formed on said substrate, a ground conductors on said substrate, said ground conductors interposing said central conductor therebetween at a predetermined distance away and being connected to ground, a storage part opened by cutting said central conductor; and a head including, a base being removable from said storage part, first and second insulative plates formed on said base with a predetermined interval, first and second wiring patterns respectively formed on said first and second plates and respectively connected to said cut central conductors, and a first ground patterns formed on said first plate, wherein said first ground pattern being connected to the ground.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

[First Embodiment]

Figure 1:
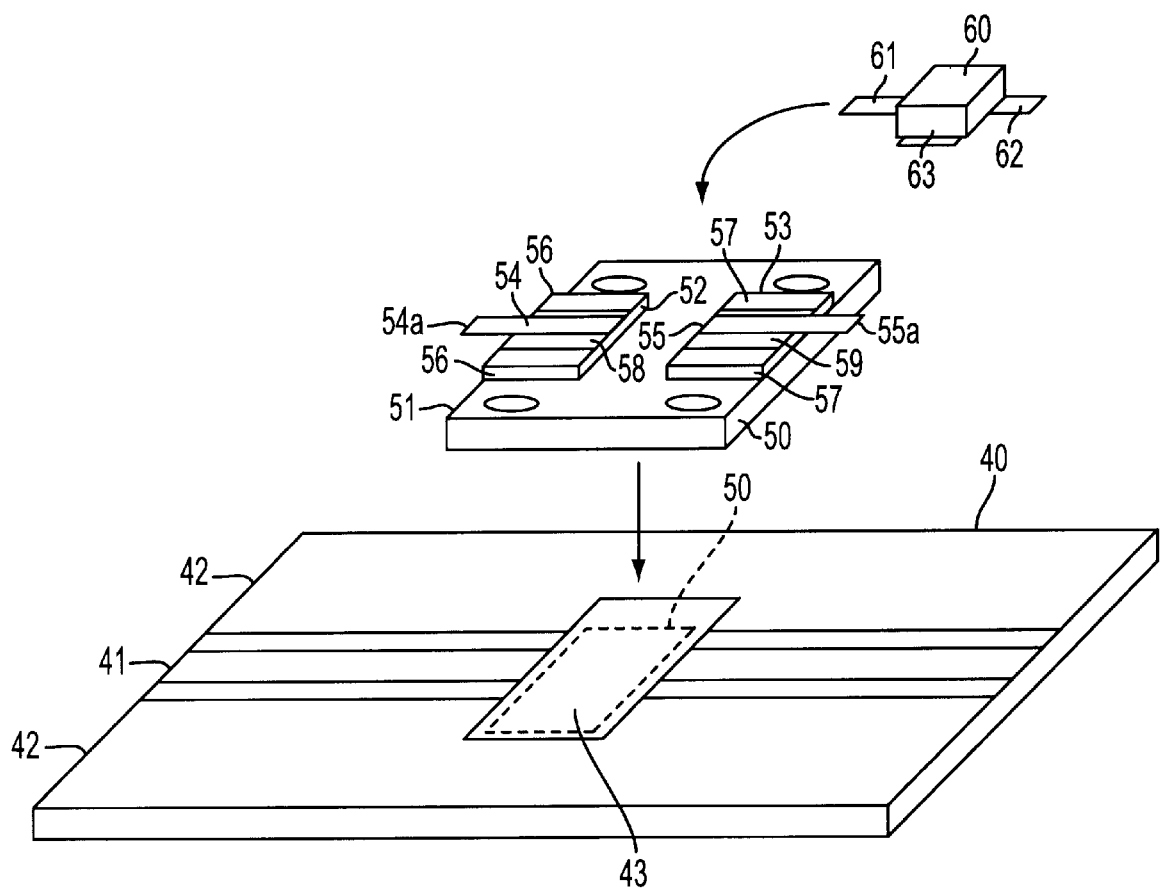
FIG. 1 is a fragmentary perspective view showing a device evaluation circuit showing a first embodiment of the present invention.

FIG. 1 is a fragmentary perspective view of a device evaluation circuit showing a first embodiment of the present invention.

The present device evaluation circuit is used to evaluate dc and high-frequency electric characteristics of an IC as is the case of the prior art. Further, the device evaluation circuit comprises a board or substrate 40 similar to one employed in the prior art and a ceramic head 50 different in configuration from one employed in the prior art.

Figure 2:
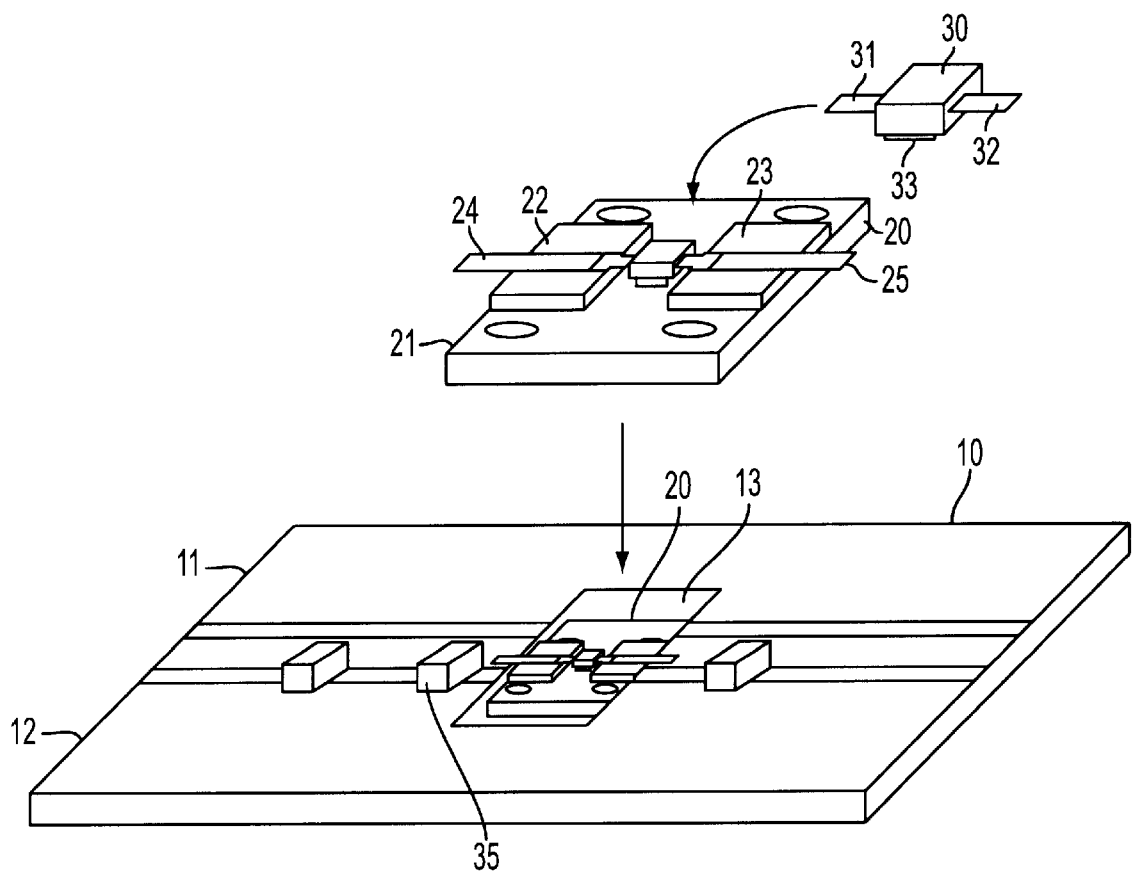
FIG. 2 is a fragmentary perspective view showing a conventional device evaluation circuit.

The substrate 40 is similar in structure to the conventional one shown in FIG. 2. A co-planar distributed constant circuit made up of a micro strip line 41 used as a central conductor and ground conductors 42 placed on both sides thereof at a predetermined distance away is formed on the surface of the substrate 40. Each of the ground conductors 42 is electrically connected to a ground placed on the lower side of the substrate 40 through an unillustrated through hole or the like. An accommodation or storage part 43 opened by cutting the micro strip line 41 is formed in the center of the substrate 40. The ceramic head 50 is held in the storage part or opening 43 so as to be insertable therein and removable therefrom.

The ceramic head 50 has a pedestal or base 51 made of a conductive metal, ceramic plates 52 and 53 used as first and second plates, which are fixed onto the base 51 with a predetermined interval defined therebetween, and micro strip lines 54 and 55 used as first and second wiring patterns, which are respectively formed on the ceramic plates 52 and 53 by evaporation. Further, the ceramic head 50 is provided with unprecedented first and second electrodes or ground patterns 56 and 57. The ground patterns 56 are formed on the upper portion and sides of the ceramic plate 52 by evaporation. In the upper portion of the ceramic plate 52, the ground patterns 56 interpose or sandwich the micro strip line 54 therebetween from both sides at predetermined intervals or distances away. In the sides of the ceramic plate 52, the ground patterns 56 are kept in contact with the base 51 located on the lower side of the ceramic plate 52. The ground patterns 57 are formed on the upper portion and sides of the ceramic plate 53 by evaporation. In the upper portion of the ceramic plate 53, the ground patterns 57 interpose the micro strip line 55 from both sides at predetermined distances away from each other. In the sides of the ceramic plate 53, the ground patterns 57 are in contact with the base 51 provided on the lower side of the ceramic plate 53.

The base 51 is electrically connected to the ground by being held within the storage part 43. Contact portions 54a and 55a, which protrude from the ceramic head 50, are respectively provided so as to extend at the ends of the micro strip lines 54 and 55. Further, the contact portions 54a and 55a are connected to both side micro strip lines 41 on the substrate 40 when held within the storage part 43.

An IC 60 is mounted between the ceramic plates 52 and 53 of the ceramic head 50. The IC 60 has, for example, a GaAs FET incorporated therein. A gate terminal 61 of the FET incorporated in the IC 60 is electrically connected to the micro strip line 54. Further, a drain terminal 62 thereof is electrically connected to the micro strip line 55 and a source terminal 63 thereof is electrically connected to the base 51.

Since the ground patterns 56 and 57 are provided on the ceramic head 50 in the device evaluation circuit shown in FIG. 1, matching devices can be respectively implemented in areas 58 respectively defined between the ground patterns 56 and the micro strip line 54 and areas 59 respectively defined between the ground patterns 57 and the micro strip line 55. A trimmer condenser, a chip capacitor or a chip coil or the like is used as the matching device. When one attempts to evaluate electric characteristics of several types of mounted devices to be measured by using the ceramic head 50, it is necessary to implement the matching devices in agreement with matching points of the devices to be measured. However, since the intervals respectively defined between the micro strip lines 54 and 55 and the ground patterns 56 and 57 are uniform and the ground patterns 56 and 57 are evenly connected to the ground through the sides of the ceramic plates 52 and 53 in the ceramic head 50, inductance components remain unchanged regardless of the positions of implementation of the matching devices.

When the matching devices are mounted, the characteristic impedance of the IC 60 and the characteristic impedance of an unillustrated external measurement system in which a signal is inputted to and outputted from the IC 60 through the micro strip lines 41, 54 and 55, are matched to each other upon evaluating the high-frequency characteristic of the IC 60, and no power is reflected from the junction between the two. Thus, the original characteristic of the IC 60 is evaluated.

Since the ground patterns 56 and 57 are provided on the ceramic head 50 in the first embodiment as described above, the matching devices can be implemented in the areas 58 respectively defined between the ground patterns 56 and the micro strip line 54 and the areas 59 respectively defined between the ground patterns 57 and the micro strip line 55. It is also possible to easily match the characteristic impedances of the IC 60 and the measurement system.

[Second Embodiment]

Figure 3:
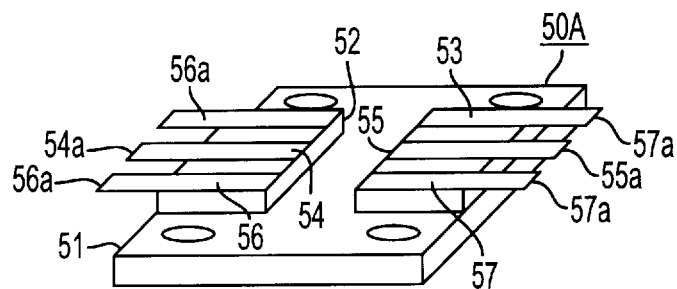
FIG. 3 is a perspective view for describing a structure of a ceramic head showing a second embodiment of the present invention.

FIG. 3 is a perspective view of a structure of a ceramic head showing a second embodiment of the present invention. Elements common to those shown in FIG. 2 are identified by common reference numerals.

A ceramic head 50A is insertably and removably held in the substrate 40 of the device evaluation circuit illustrated in the first embodiment. The ceramic head 50A has a base 51 made of a conductive metal similar to that employed in the first embodiment, ceramic plates 52 and 53 used as first and second plates, which are formed on the base 51 with a predetermined interval defined therebetween, micro strip lines 54 and 55 used as first and second wiring patterns, which are respectively formed on the ceramic plates 52 and 53 by evaporation, and first and second ground patterns 56 and 57. The ground patterns 56 are formed on the upper portion and sides of the ceramic plate 52 by evaporation. In the upper portion of the ceramic plate 52, the ground patterns 56 interpose or sandwich the micro strip line 54 therebetween from both sides at predetermined intervals or distances away. In the sides of the ceramic plate 52, the ground patterns 56 are kept in contact with the base 51 located on the lower side of the ceramic plate 52. The ground patterns 57 are formed on the upper portion and sides of the ceramic plate 53 by evaporation. In the upper portion of the ceramic plate 53, the ground patterns 57 interpose the micro strip line 55 therebetween from both sides at predetermined distances away from each other. In the sides of the ceramic plate 53, the ground patterns 57 are in contact with the base 51 provided on the lower side of the ceramic plate 53. Contact portions 54a and 55a are respectively provided so as to extend from the ceramic head 50A at the ends of the micro strip lines 54 and 55. Further, the contact portions 54a and 55a are connected to both side micro strip lines 41 on the substrate 40 when held within the storage part 43.

The ceramic head 50A is additionally provided with first contact portions 56a and second contact portions 57a. The contact portions 56a extend from the ends of the ground patterns 56 so as to protrude from the ceramic head 50A. The contact portions 57a extend from the ends of the ground patterns 57 so as to protrude from the ceramic head 50A. Since the contact portions 56a and 57a contact ground conductors 42 formed on the substrate 40 when the ceramic head 50A provided with the contact portions 56a and 57a is accommodated within the storage part 43 of the substrate 40, the contact portions 56a and 57a are soldered to the ground conductors 42 so that the ground patterns 56 and 57 are electrically connected to the ground conductors 42, respectively. Thus, the ground patterns 56 and 57 and the ground conductors 42 are kept at the same potential.

An IC 60 to be measured is mounted on the ceramic head 50A and matching devices are implemented in a manner similar to the first embodiment. In this condition, the electric characteristic of the IC 60 is evaluated.

Since the ceramic head 50A is provided with the contact portions 56a and 57a and the contact portions 56a and 57a are soldered to the ground conductors 42 of the substrate 40 in the second embodiment as described above, the ground conductors 42 and the ground patterns 56 and 57 of the ceramic head 50A can be set to the same potential and parasitic capacitors and inductors or the like that exist in the ceramic head 50A, can be reduced, whereby the accuracy of measurements is improved.

[Third Embodiment]

Figure 4:
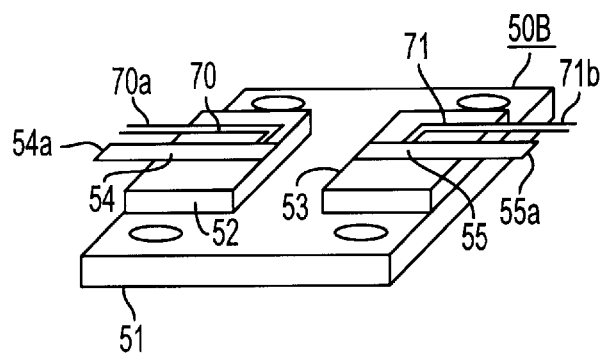
FIG. 4 is a perspective view for describing a structure of a ceramic head showing a third embodiment of the present invention.
Figure 5:
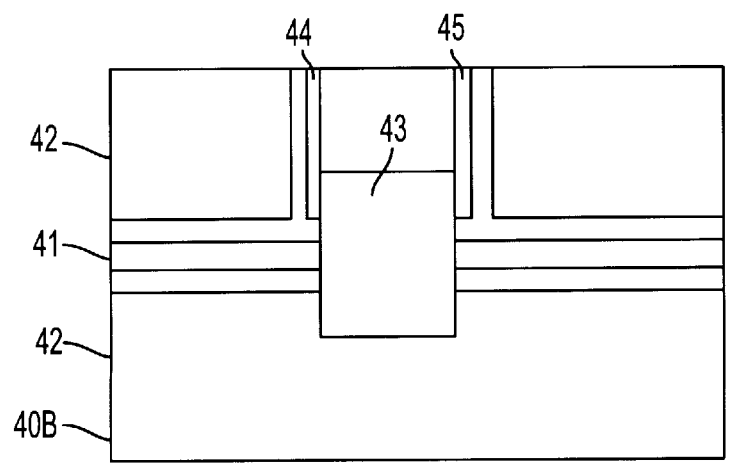
FIG. 5 is a plan view illustrating a substrate equipped with the ceramic head shown in FIG. 4.

FIG. 4 is a perspective view of a structure of a ceramic head showing a third embodiment of the present invention. FIG. 5 is a plan view of a substrate equipped with the ceramic head shown in FIG. 4. In these FIGS. 4 and 5, elements common to those shown in FIG. 2 are identified by common reference numerals.

A ceramic head 50B is provided with a base 51 made of a conductive metal similar to that employed in the first embodiment, ceramic plates 52 and 53 used as first and second plates, which are formed on the base 51 with a predetermined interval defined therebetween, and micro strip lines 54 and 55 used as first and second wiring patterns, which are respectively formed on the ceramic plates 52 and 53 by evaporation. First and second bias lines or electrodes 70 and 71 formed in a manner similar to the micro strip lines 54 and 55 are respectively formed on the ceramic plates 52 and 53. The bias lines 70 and 71 supply bias voltages to the micro strip lines 54 and 55 respectively.

Contact portions 54a and 55a, which protrude from the ceramic head 50B, are respectively provided in extended form at the ends of the micro strip lines 54 and 55. Contact portions 70a and 71a, which project from the ceramic head 50B, are respectively provided in extended form at the ends of the bias lines 70 and 71.

The ceramic head 50B shown in FIG. 4 is insertably and removably mounted to a substrate 40B shown in FIG. 5 by way of example. A micro strip line 41 used as a central conductor and ground conductors 42 placed on both sides of the micro strip line 41 at a predetermined distance away are formed on the surface of the substrate 40B. Each of the ground conductors 42 is electrically connected a ground placed on the lower side of the substrate 40B through an unillustrated through hole or the like. An accommodation or storage part 43 opened by cutting the micro strip line 41 is formed in the center of the substrate 40B. The ceramic head 50B is held in the storage part 43 so as to be insertable therein and removable therefrom. The ground conductors 42 of the substrate 40B are different from those of the substrate 40 shown in FIG. 1 and are not provided at portions of the periphery of the storage part 43. In the ground conductors 42, however, patterns 44 and 45 for supplying bias potentials to the portions are formed as shown in FIG. 5. When the ceramic head 50B is mounted in the storage part 43, the bias patterns 44 and 45 are brought into contact with their corresponding contact portions 70a and 71a. The bias patterns 44 and 45 are configured so as to supply bias potentials supplied from the outside to the micro strip lines 54 and 55 through the contact portions 70a and 71a and bias lines 70 and 71 of the ceramic head 50B. The micro strip line 41 inputs a signal for a measurement system to and output it from the micro strip lines 54 and 55 through the contact portions 54a and 55a.

Since the bias patterns 44 and 45 are provided on the substrate 40B and the ceramic head 50B is provided with the contact portions 70a and 71a and the bias lines 70 and 71 in the third embodiment as described above, points for biasing the micro strip lines 54 and 55 can be set in the neighborhood of an IC 60 to be measured and the loss of a measuring current flowing from a drain terminal 62 of the IC 60 to a source terminal 63 thereof can be reduced to a minimum. Thus, the accuracy of evaluation is improved as compared with the case where the conventional device evaluation circuit is used.

Incidentally, the present invention is not necessarily limited to the aforementioned embodiments. Various modifications can be made to the invention. The following are given as examples of the modifications.

(1) Although the bias potentials are introduced through the substrate 40B in the third embodiment, the bias potentials supplied from the outside may be directly introduced into the bias lines 70 and 71 respectively without the provision of the bias patterns 44 and 45 and the contact portions 70a and 71a.

(2) Although the ceramic head 50B is provided with the bias lines 70 and 71 in the third embodiment, the ceramic head 50B may be provided with the ground patterns 56 and 57 as in the first and second inventions.

Figure 6:
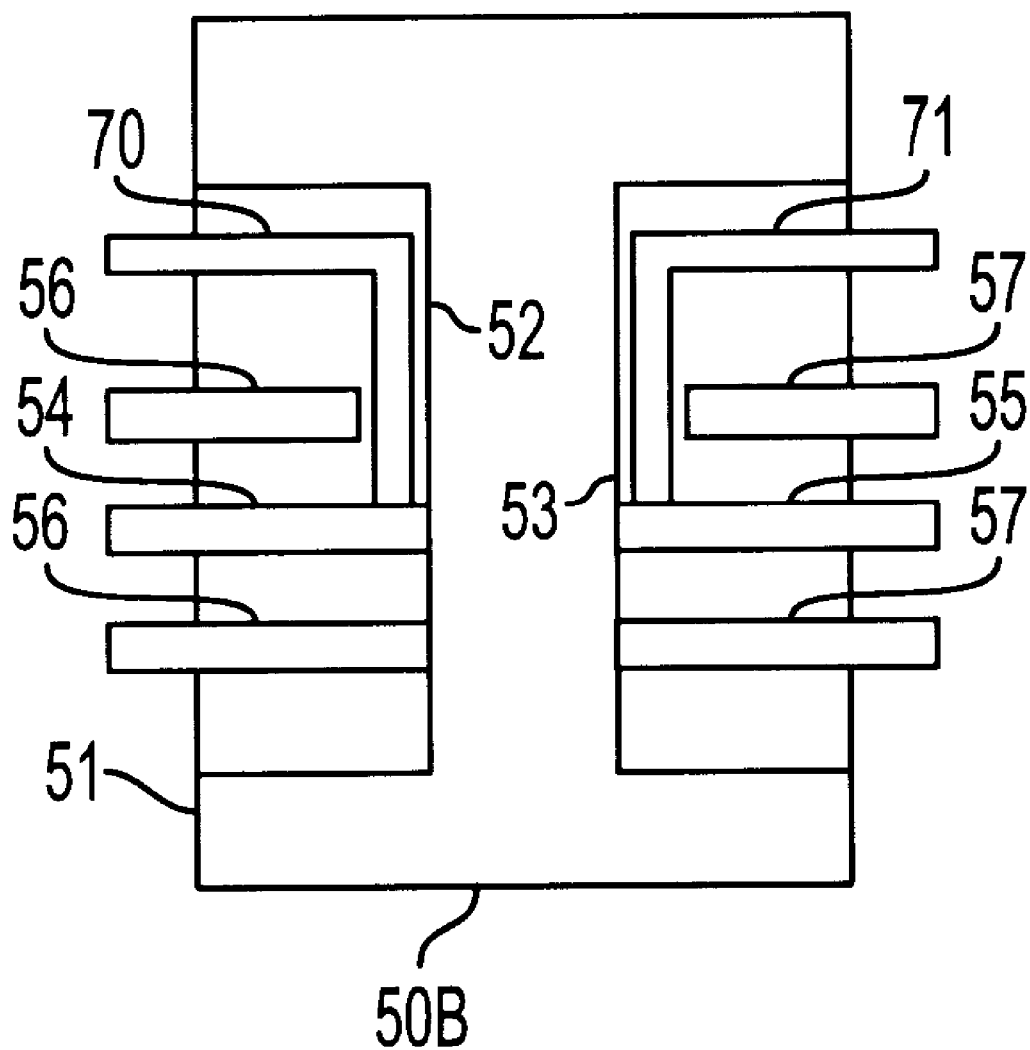
FIG. 6 is a plan view of a ceramic head showing a modification of FIG. 4.

FIG. 6 is a plan view of a ceramic head showing a modification of the ceramic head shown in FIG. 4.

As shown in FIG. 6, for example, bias lines 70 and 71 are formed so as to pass through portions of ground patterns 56 and 57 on respective ceramic plates 52 and 53 without having to form the portions thereof. As a result, a device evaluation circuit can be implemented which has both the advantageous effect obtained in the first or second embodiment and the advantageous effect obtained in the third embodiment.

According to the embodiments of the invention, as have been described above in detail, first ground patterns electrically connected to ground are formed on a first plate formed on a head. Therefore, if matching devices or the like are placed between the respective first ground patterns and a first wiring pattern, then the matching between the impedances is performed in the immediate vicinity of a device to be evaluated and hence the accuracy of measurements is improved.

According to other embodiments of the invention, since a first ground pattern for supplying a bias potential to a first wiring pattern is formed on a first plate provided on a head, the bias potential can be applied thereto at a position very close to a device to be evaluated, so that the accuracy of making measurements on the properties of the device to be evaluated is improved.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A device evaluation circuit comprising:
   a substrate;
   a central conductor having first and second spaced parts formed on said substrate, said central conductor having a storage opening interposed between said first and second spaced parts;
   ground conductors formed on said substrate, said ground conductors interposing said central conductor therebetween at a predetermined distance therefrom and being connected to ground; and
   a head including,
   a base, said base being removably insertable within said storage opening;
   first and second insulative plates formed on said base with a predetermined interval therebetween; and
   first and second wiring patterns respectively formed on said first and second plates and respectively connected to the first and second spaced parts of said central conductor; and
   first ground patterns formed on said first plate and connected to ground.

2. A device evaluation circuit according to claim 1, wherein said first ground patterns have contact portions in contact with said ground conductors when said base is positioned within said storage opening.

3. A device evaluation circuit according to claim 2, wherein said first ground patterns interpose said first wiring pattern therebetween at predetermined distances therefrom.

4. A device evaluation circuit according to claim 3, wherein second ground patterns electrically connected to ground are formed on said second plate.

5. A device evaluation circuit according to claim 4, wherein said second ground patterns are respectively provided with contact portions brought into contact with said ground conductors when said base is positioned within said storage opening.

6. A device evaluation circuit according to claim 2, wherein second ground patterns electrically connected to ground are formed on said second plate.

7. A device evaluation circuit according to claim 6, wherein said second ground patterns are respectively provided with contact portions brought into contact with said ground conductors when said base is positioned within said storage opening.

8. A device evaluation circuit according to claim 2, wherein said base comprises a conductive member electrically connected to ground when held in said storage opening.

9. A device evaluation circuit according to claim 1, wherein said first ground patterns interpose said first wiring pattern therebetween at predetermined distances therefrom.

10. A device evaluation circuit according to claim 9, wherein second ground patterns electrically connected to ground are formed on said second plate.

11. A device evaluation circuit according to claim 10, wherein said second ground patterns are respectively provided with contact portions brought into contact with said ground conductors when said base is positioned within said storage opening.

12. A device evaluation circuit according to claim 1, wherein second ground patterns electrically connected to ground are formed on said second plate.

13. A device evaluation circuit according to claim 12, wherein said second ground patterns are respectively provided with contact portions brought into contact with said ground conductors when said base is positioned within said storage opening.

14. A device evaluation circuit according to claim 13, wherein said second ground patterns interpose said first wiring pattern therebetween at predetermined distances therefrom.

15. A device evaluation circuit according to claim 12, wherein said second ground patterns interpose said first wiring pattern therebetween at predetermined distances therefrom.

16. A device evaluation circuit according to claim 12, wherein said base comprises a conductive member electrically connected to ground when held in said storage opening.

17. A device evaluation circuit according to claim 1, wherein said base comprises a conductive member electrically connected to ground when held in said storage opening.

18. A device evaluation circuit comprising:
   a substrate;
   a central conductor having first and second spaced parts formed on said substrate, said central conductor having a storage opening interposed between said first and second spaced parts;
   ground conductors formed on said substrate, said ground conductors interposing said central conductor therebetween at a predetermined distance therefrom and being connected to ground; and
   a head including,
   a base, said base being removably insertable within said storage opening;

first and second insulative plates formed on said base with a predetermined interval therebetween; and first and second wiring patterns respectively formed on said first and second plates and respectively connected to the first and second spaced parts of said central conductor; and a first bias line formed on said first plate, said first bias line supplying a bias potential to said first wiring pattern.

19. A device evaluation circuit according to claim 18, further comprising a second bias line for supplying a bias potential to said second wiring pattern formed on said second plate.

20. A device evaluation circuit according to claim 15, wherein said base comprises a conductive member electrically connected to ground when held in said storage opening.

21. A device evaluation circuit, comprising:

a substrate;

a central conductor for conducting a measurement signal, said central conductor having first and second spaced parts formed on said substrate and a storage opening interposed between said first and second spaced parts;

ground conductors formed on said substrate, said ground conductors interposing said central conductor therebetween at a predetermined distance therefrom and being connected to ground;

a base, said base being removably insertable within said storage opening;

first and second plates formed on said base a predetermined distance apart from each other;

first and second wiring patterns respectively formed on said first and second plates and respectively connected to said first and second spaced parts of said central conductor; and a first electrode formed on said first plate and connected to a predetermined potential.

22. The device according to claim 21 wherein the first electrode is connected to said first wiring pattern and applies said predetermined potential to said first wiring pattern.

23. The device according to claim 21 wherein said first electrode is connected to ground and is spaced a predetermined distance from said first wiring pattern.

24. The device according to claim 21 wherein said first electrode is connected to said substrate and is maintained at said predetermined potential.

25. The device according to claim 22 wherein said ground conductors are separated from a periphery of said storage opening.

26. The device according to claim 25 further comprising a bias pattern formed on said substrate at said periphery of said storage opening, said bias pattern supplying said predetermined potential to said first electrode.

* * * * *